(12) United States Patent
Kwon et al.

(10) Patent No.: US 9,335,770 B2
(45) Date of Patent: May 10, 2016

(54) OPTICAL TRANSCEIVER CAPABLE OF CONTROLLING SELF-HEATING ACCORDING TO TEMPERATURE

(71) Applicant: Lightron Fiber-Optic Devices Inc., Daejeon (KR)

(72) Inventors: Yoon Koo Kwon, Cheonju-si (KR); Seung Joon Kim, Daejeon (KR); Young Un Heo, Daejeon (KR)

(73) Assignee: Lightron Fiber-Optic Devices Inc., Daejeon (KR)

( * ) Notice: Subject to any disclaimer, the term of this patent is extended or adjusted under 35 U.S.C. 154(b) by 111 days.

(21) Appl. No.: 14/241,251

(22) PCT Filed: Oct. 24, 2012

(86) PCT No.: PCT/KR2012/008736
§ 371 (c)(1),
(2) Date: Feb. 26, 2014

(87) PCT Pub. No.: WO2013/065989
PCT Pub. Date: May 10, 2013

(65) Prior Publication Data
US 2015/0037043 A1    Feb. 5, 2015

(30) Foreign Application Priority Data

Nov. 1, 2011  (KR) .......... 10-2011-0113048

(51) Int. Cl.
*H04B 10/40* (2013.01)
*G05D 23/24* (2006.01)
*H01S 5/024* (2006.01)
*H01S 5/00* (2006.01)
*H01S 5/022* (2006.01)

(52) U.S. Cl.
CPC ............ *G05D 23/24* (2013.01); *H01S 5/02453* (2013.01); *H04B 10/40* (2013.01); *H01S 5/0071* (2013.01); *H01S 5/02248* (2013.01)

(58) Field of Classification Search
None
See application file for complete search history.

(56) References Cited

U.S. PATENT DOCUMENTS

| 6,007,218 A * | 12/1999 | German et al. ............... 362/259 |
| 6,236,668 B1 | 5/2001 | Osada et al. |
| 2004/0161000 A1 * | 8/2004 | Kang et al. ...................... 372/34 |
| 2006/0239316 A1 | 10/2006 | Kim et al. |

FOREIGN PATENT DOCUMENTS

| JP | 6216458 A | 8/1994 |
| JP | 2008-294262 A | * 12/2008 |
| JP | 2008294262 A | 12/2008 |
| KR | 1020000006551 A | 1/2000 |
| KR | 1020040073158 A | 8/2004 |
| KR | 1020060111760 A | 10/2006 |

* cited by examiner

*Primary Examiner* — Darren E Wolf
(74) *Attorney, Agent, or Firm* — The Webb Law Firm

(57) ABSTRACT

Disclosed is an optical transceiver capable of controlling self-heating according to temperature, more particularly, an optical transceiver which uses a PTC heater suitable for temperature characteristics to easily control self-heating. A PTC heater of which the self-resistance changes depending on the ambient temperature of uncooled laser diodes of an optical transceiver so as to adjust heating volume of the heater, is applied to a TO CAN, thus making it possible to significantly reduce power consumption while expanding an available temperature range of existing optical modules, even without a separate controller or using a minimum number of control circuits.

7 Claims, 8 Drawing Sheets

OPTICAL TRANSCEIVER CAPABLE OF CONTROLLING SELF-HEATING ACCORDING TO TEMPERATURE

CROSS-REFERENCE TO RELATED APPLICATIONS

This application is the United States national phase of International Application No. PCT/KR2012/008736 filed Oct. 24, 2012, and claims priority to Korean Patent Application No. 10-2011-0113048 filed Nov. 1, 2011, the disclosures of which are hereby incorporated in their entirety by reference.

TECHNICAL FIELD

The present invention relates to an optical transceiver capable of controlling self-heating according to temperature, and more particularly, to an optical transceiver which uses a positive temperature coefficient (PTC) heater suitable for temperature characteristics to easily control self-heating.

BACKGROUND ART

An optical transceiver is a core apparatus which converts an electrical signal, such as video, audio, and data, into an optical signal or reversely converts the optical signal into the electrical signal in an optical communication system such as an optical repeater to be able to provide communication between systems.

As the optical transceiver used in an optical repeater for wireless mobile communication in the beginning, a basic optical transceiver using a laser diode (LD) having a wavelength of 1310 nm and 1550 nm has been mainly used. However, for advancement and more efficient operation of the optical repeater, the optical transceiver is being developed to have a structure of using a plurality of coarse wavelength division multiplexing (CWDM) LDs, such as 1490 nm, 1510 nm, 1530 nm, and 1570 nm in addition to 1310 nm and 1550 nm.

For the use of the plurality of CWDM LDs, there is a need to use a more precise CWDM wavelength filter to reduce interference between LDs having a proximity wavelength.

However, the use of the CWDM filter may cause several problems. As a representative example of the problems, the optical signal of the LD is filtered within an operation temperature of equipment, thereby reducing performance of the optical communication system or in the worst case, stopping the operation thereof.

A general laser diode used in the existing optical transceiver has many limitations in a wavelength use region since the wavelength is changed with the change in temperature of ambient environment. In particular, in the case of a low-density coarse wavelength division multiplexing (CWDM) optical module, when a general uncooled laser diode is used in a temperature range of −40° C. to +85° C. (generally, temperature range of 0° C. to +70° C.), the wavelength of the laser diode (LD) is changed as much as about 0.1 nm/° C. with the change in temperature, thereby causing the wavelength interference between the channels.

To remove the interference effect, the uncooled laser diode may not accept the change in a maximum of wavelength of +/−6.5 nm from central wavelengths which are referenced for each wavelength channel. Since the uncooled laser diode limits the use of laser, the uncooled laser diode may not be mass-produced and the price thereof may rise.

The problem may be resolved by using a cooled laser diode using a temperature electric cooler (TEC). As an example of the cooled laser diode using the TEC, there may be Korean Patent Laid-Open Publication No. 10-2006-0111760 (Apparatus For Controlling Use Temperature Of Optical Module Using Uncooled Laser Diode).

In this case, however, when the uncooled laser diode is applied to the low-density coarse wavelength division multiplexing (CWDM) optical module, the price of equipment rises due to addition of a circuit for controlling temperature, rising cost of raw materials of TEC, difficulty in an assembly, and the like, such that it is difficult to commercialize the uncooled laser diode.

Further, when using a general heater, the uncooled laser diode additionally requires a control circuit for sensing temperature and controlling the temperature so as to control the heater, such that a circuit may be complicated, and additionally requires a PCB layer for the control circuit, such that the difficulty in an assembly may be increased and a considerable large space may be required.

Technical Problem

An object of the present invention is to provide an optical transceiver capable of controlling temperature without adding a control circuit for controlling temperature.

Another object of the present invention is to provide an optical transceiver capable of greatly reducing power consumption while expanding an available temperature range of the existing optical module without the separate control apparatus and by using a minimum of control circuits.

Technical Solution

According to an exemplary embodiment of the present invention, there is provided an optical transceiver for controlling self-heating according to temperature, including: a laser diode; a stem body which is coupled with the laser diode; a positive temperature coefficient (PTC) heater which is coupled with the stem body to be self-heated; and a laser driving unit which drives the laser diode.

The PTC heater may be made of a $BaTiO_3$ material.

The stem body and the PTC heater may be coupled with each other by any one of a scheme of forming a plurality of holes in the PTC heater and using lead pins inserted into the holes, a scheme of bonding the PTC heater on a surface of the stem body by an adhesive; and a scheme of bonding the PTC heater to an opposite side of the laser diode by the adhesive.

The thickness of the PTC heater may range from 0.2 to 1.00 mm.

According to another exemplary embodiment of the present invention, there is provided an optical transceiver for controlling self-heating according to temperature, including: a laser diode; a stem body which is coupled with the laser diode; a positive temperature coefficient (PTC) heater which is coupled with the stem body to be self-heated; a control circuit unit which controls the PTC heater; and a laser driving unit which drives the laser diode.

The control circuit unit may include: a thermistor which senses a temperature of the PTC heater; a switching unit which is turned on or off by the thermistor to apply power to the PTC heater; and a resistor which controls a strength of applied power.

Advantageous Effects

According to the exemplary embodiments of the present invention, the positive temperature coefficient (PTC) heater of which the self-resistance changes depending on the ambient temperature of the uncooled laser diodes of the optical transceiver so as to adjust the heating volume of the heater, is applied to the TO CAN, thus making it possible to significantly reduce power consumption while expanding the available temperature range of the existing optical modules, even without the separate controller or using a minimum number of control circuits.

Further, according to the exemplary embodiments of the present invention, unlike the existing product, the control apparatus is removed or simplified and the heater of the PTC material of which the resistance value is changed according to the temperature is used, thereby improving the ease of assembly and minimizing the volume of a product while expanding the available temperature range of the CWDM optical transceiver to −40° C. to 85° C.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

Figure 1:
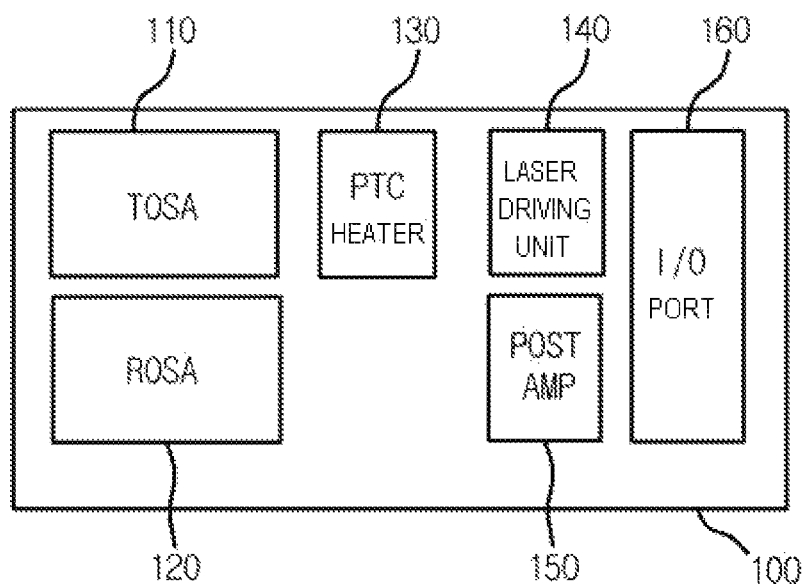
FIG. 1 is a configuration block diagram of an optical transceiver using a PTC heater without a control circuit according to an exemplary embodiment of the present invention.

100, 200: Optical transceiver
110: TOSA (Transmitter Optical Sub-Assembly)
120: ROSA (Receiver Optical Sub-Assembly)
130: PTC (Positive Temperature Coefficient) heater
140: Laser driving unit
150: POST AMP
160: I/O port
210: Control circuit unit
211: Switching unit
213: Thermistor
215: Resistor
520: Photo diode
530: Laser diode chip
600: Mirror

BEST MODE

Hereinafter, an optical transceiver capable of controlling self-heating according to temperature of exemplary embodiments of the present invention will be described with reference to the accompanying drawings. The drawings to be provided below are provided by way of example so that the idea of the present invention can be sufficiently transferred to those skilled in the art to which the present invention pertains. Therefore, the present invention is not be limited to the drawings provided below but may be modified in many different forms. In addition, throughout the specification, like reference numerals denotes like components.

Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

FIG. 1 is a configuration block diagram of an optical transceiver using a PTC heater without a control circuit according to an exemplary embodiment of the present invention. Referring to FIG. 1, an optical transceiver 100 capable of controlling self-heating according to temperature is configured to include a laser diode (not illustrated), a stem body (not illustrated) which is coupled with the laser diode, a positive temperature coefficient (PTC) heater 130 which is coupled with the stem body to be self-heated, a laser driving unit 140 which drives the laser diode, and the like.

The optical transceiver 100 is an apparatus for optical communication by using a method for transporting a large amount of information. The optical communication serves to communicate information among countries and communicate a large capacity of information to the home through an optical repeater by schemes, such as a fiber to the home (FTTH) and a fiber to the pole (FTTP). To implement the optical communication for communicating a large amount of information, a light emitting element which is an element emitting light used for optical communication, an optical fiber which is a medium through which an optical signal is transmitted, and a light receiving element which converts an optical signal into an electrical signal are essentially required.

Among them, as the light emitting element which emits light used for the optical communication, a laser diode (LD) which uses a method for manufacturing a semiconductor device has been used. The laser diode is an element which converts an electrical signal into a light (optical) signal.

Operation characteristics of the laser diode show characteristics which are sensitive to temperature. Generally, when an operation temperature of the laser diode rises, a Fermi-Dirac function which determines a distribution probability depending on energy of electrons and holes is widely distributed in a wide energy band, such that a gain of light represented by a function of a difference between electron/hole density functions in a unit energy band may be reduced, a hot carrier overflow may be increased, and an Auger recombination may be increased.

This phenomenon becomes a factor of reducing an internal gain and increasing an internal loss of the laser diode and reduces injection efficiency of electrons, and thus reducing characteristics of current-output optical power of the laser diode.

The environment in which the optical communication system is currently installed internationally requests that the laser diode needs to be stably operated within a range from −40° C. to 85° C.

In particular, a laser diode for coarse wavelength division multiplexing (CWDM) and local area network (LAN)-WDM, of which the temperature needs to be controlled in a very narrow range, is optimally operated at a room temperature of about 25° C. Therefore, there is a need to keep an operational environment temperature of the laser diode at a predetermined temperature.

Therefore, when the temperature of the PTC heater 130 falls to a predetermined temperature or less, a resistance value is reduced, such that the PTC heater may generate heat at an appropriate temperature and when the temperature of the PTC heater 30 is a predetermined temperature or more, the resistance value is suddenly increased, such that the PTC heater 30 may stop generation of heat and thus may generate heat only in a low temperature. Due to the heating phenomenon, when heat is applied to the laser diode (not illustrated), the temperature of the laser diode rises.

Therefore, the PTC heater 130 generates heat as much as the ambient temperature which has fallen to compensate for temperature, thereby making it possible to suppress the change in wavelength according to the temperature of the laser diode. Consequently, a wavelength interference between channels does not occur, such that the temperature range of the optical transceiver may be expanded. To this end, the PTC heater 130 is made of a BaTiO₃ material and a thickness of the PTC heater 130 ranges from 0.2 to 1.00 mm.

Referring continuously to FIG. 1, the optical transceiver 100 illustrated in FIG. 1 includes a transmitter optical sub assembly (TOSA) 110, a receiver optical sub assembly (ROSA) 120, a POST AMP 150, an input/output (I/O) port 160, and the like, in addition to components as described above.

The POST AMP 150 which is a post amplifier serves to amplify the optical signal.

Figure 2:
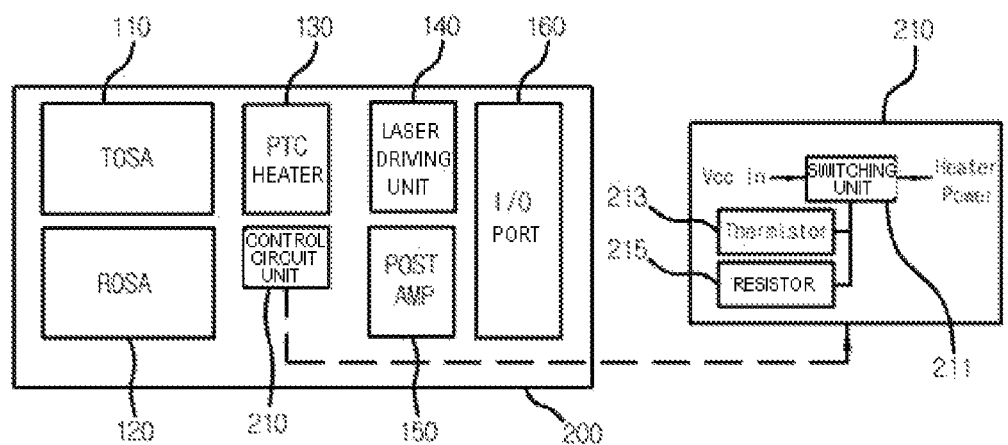
FIG. 2 is a configuration block diagram of an optical transceiver using a PTC heater with a control circuit according to another exemplary embodiment of the present invention.

FIG. 2 is a configuration block diagram of an optical transceiver 100 using a PTC heater with a control circuit 210 according to another exemplary embodiment of the present invention. Referring to FIG. 2, an optical transceiver 100 is configured to include the laser diode (not illustrated), the stem body (not illustrated) which is coupled with the laser diode, the positive temperature coefficient (PTC) heater 130 which is coupled with the stem body to be self-heated, a control circuit unit 210 which controls the PTC heater 130, the laser driving unit 140 which drives the laser diode, and the like.

Unlike FIG. 1, the optical transceiver 100 illustrated in FIG. 2 is configured to further include a control circuit unit 210 which controls the PTC heater 130. The control circuit unit 210 is configured to include a thermistor 213 which senses the temperature of the PTC heater 130, a switching unit 211 which is turned on or off by the thermistor 213 to apply power to the PTC heater 130, a resistor 215, and the like.

Therefore, when temperature falls to a predetermined temperature or less, a resistance value of the resistor 215 is reduced to be generate heat at an appropriate temperature and when temperature reaches a predetermined temperature or more, the resistance value thereof suddenly rises to stop the generation of heat. That is, the control circuit unit 210 performs the generation of heat only in a low temperature.

Figure 3:
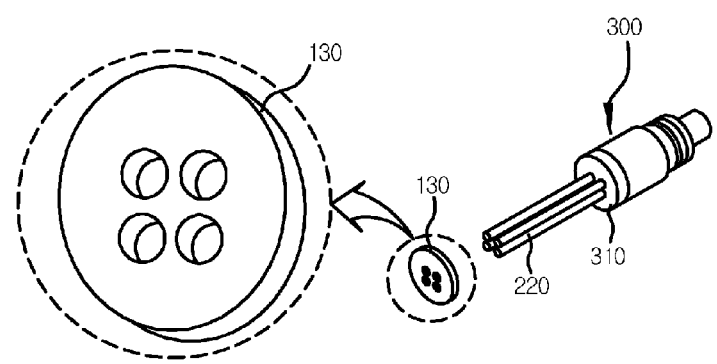
FIG. 3 is a perspective view of a state in which a PTC heater according to a first exemplary embodiment of the present invention is assembled in a stem body in an optical transceiver of a TO CAN type.

FIG. 3 is a perspective view of a state in which a PTC heater according to a first exemplary embodiment of the present invention is assembled in a stem body 310 in the optical transceiver 100 of a TO CAN type. Referring to FIG. 3, lead pins 320 which are formed on a stem body 310 coupled with a laser diode 300 are coupled with the PTC heater 130. Further, to this end, the PTC heater 130 has a cylindrical shape in which four holes are formed. In other words, in FIG. 3, the stem body 310 and the PTC heater 130 are combined by using a scheme of forming a plurality of holes in the PTC heater 130 and inserting the lead pins 320 into the holes.

Figure 4:
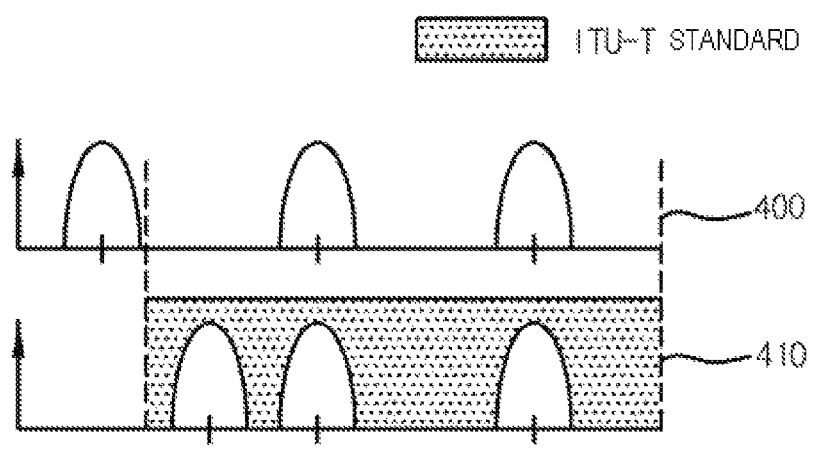
FIG. 4 is a graph illustrating a change in wavelength between the exemplary embodiment of the present invention with the related art.

FIG. 4 is a graph illustrating a change in wavelength between the exemplary embodiment of the present invention and the related art. FIG. 4 is a graph illustrating the change in wavelength according to the change in temperature between the case of using the PTC heater 130 and a general case. An upper graph 400 illustrates a case of using a general distributed feedback type—laser diode (DFB-LD) and a lower graph 410 illustrates a case of using the DFB-LD using the PTC heater 130.

Figure 5:
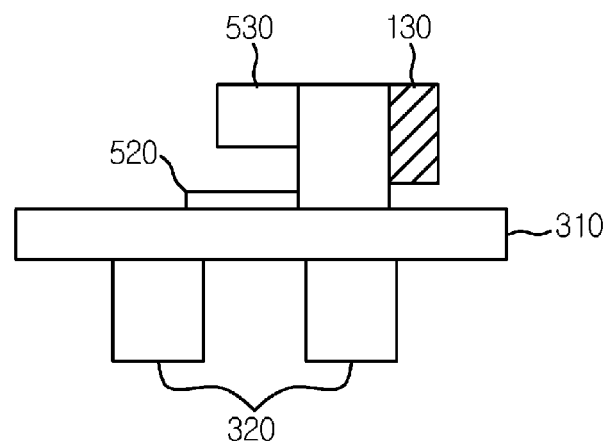
FIG. 5 is a perspective view of a state in which a PTC heater according to a second exemplary embodiment of the present invention is assembled in a stem body in an optical transceiver of a general TO package type.

FIG. 5 is a perspective view of a state in which a PTC heater according to a second exemplary embodiment of the present invention is assembled in a stem body in an optical transceiver of a general TO package type. Referring to FIG. 5, the optical transceiver illustrated in FIG. 5 is based on a general TO package type. The optical transceiver of the package type is configured to include a photo diode 520 and a laser diode chip 530, in which the photo diode 520 is a light receiving unit and the laser diode chip 530 is a light emitting unit.

In the case of FIG. 5, the PTC heater 130 is bonded to an opposite side of the laser diode chip 530 of the stem body 310 by an adhesive. In this case, a shape of the PTC heater 130 may be a square or a rectangle. FIG. 5 illustrates a scheme of bonding the PTC heater 130 to the opposite side of the laser diode by the adhesive.

Figure 6:
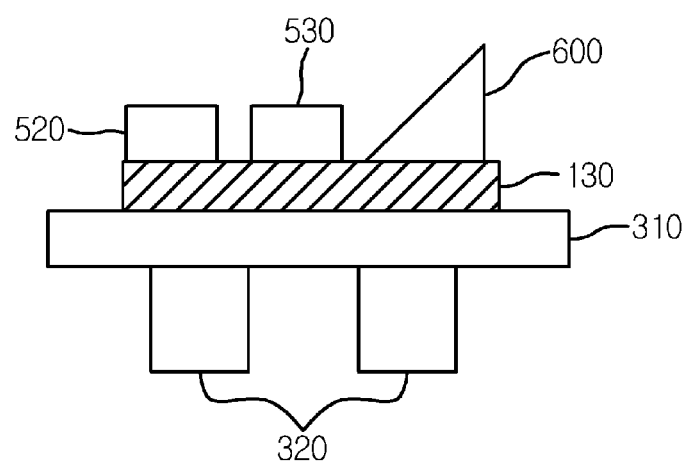
FIG. 6 is a perspective view of a state in which a PTC heater according to a third exemplary embodiment of the present invention is assembled in a stem body in an optical transceiver of a TO package type using a mirror.

FIG. 6 is a perspective view of a state in which a PTC heater according to a third exemplary embodiment of the present invention is assembled in a stem body in an optical transceiver of a TO package type using a mirror 600. Referring to FIG. 6, the optical transceiver illustrated in FIG. 5 is based on a scheme of using the mirror 600 as the TO package type. Further, the optical transceiver illustrated in FIG. 6 is configured to include the photo diode 520 and the laser diode chip 530.

In the case of FIG. 6, the PTC heater 130 is bonded just on a surface of the stem body 310 by the adhesive. That is, FIG. 6 illustrates a scheme of coupling the PTC heater 130 on the surface of the stem body by the adhesive.

Figure 7:
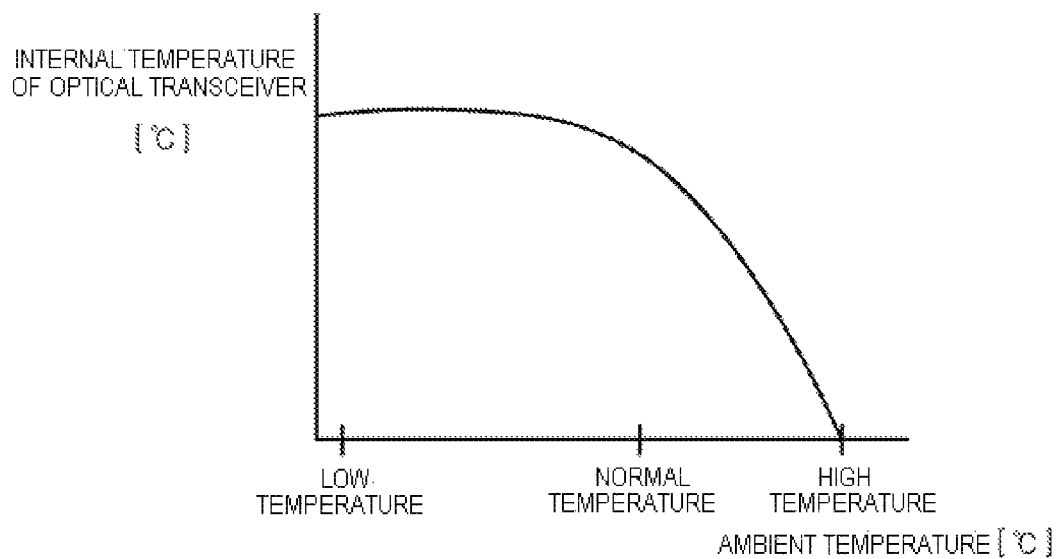
FIG. 7 is a graph illustrating a change in temperature of the PTC heater according to a change in ambient temperature according to the exemplary embodiment of the present invention.

FIG. 7 is a graph illustrating a change in temperature of the PTC heater according to a change in ambient temperature according to the exemplary embodiment of the present invention. Referring to FIG. 7, the heating temperature is increased at the low ambient temperature, the heating temperature is reduced at a normal temperature, and heat is not generated at a high temperature.

Figure 8:
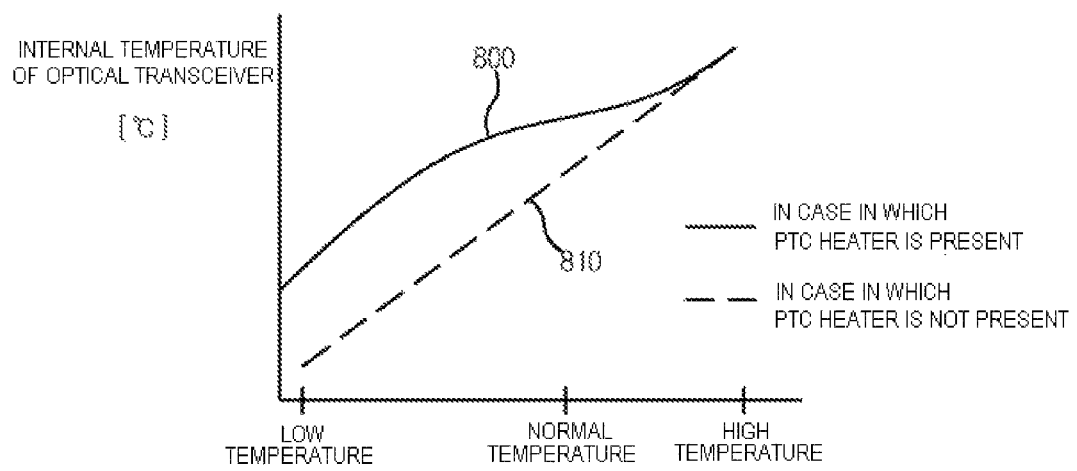
FIG. 8 is a graph illustrating a change in temperature of the optical transceiver according to a change in ambient temperature between the exemplary embodiment of the present invention and the related art.

FIG. 8 is a graph illustrating a change in temperature of the optical transceiver according to a change in ambient temperature between the exemplary embodiment of the present invention and the related art. FIG. 8 illustrates a graph of a distribution of internal temperature of the optical transceiver in a case 800 in which the PTC heater is used and a distribution of internal temperature of the optical transceiver in a case 810 in which the PTC heater is not used. In other words, a slope in the case 800 in which the PCT heater is used is smoother than that in the case 810 which the PTC heater is not used. In other words, a variation of the internal temperature is not large.

As described above, the present invention is described with reference to specific matters such as the detailed components and the limited exemplary embodiments, but is provided to help a general understanding of the present invention. Therefore, the present invention is not limited to the above exemplary embodiments and can be various changed and modified from the description by a person skilled in the art to which the present invention pertain.

Therefore, the spirit of the present invention should not be limited to the above-described exemplary embodiments, and the following claims as well as all modified equally or equivalently to the claims are intended to fall within the scope and spirit of the invention.

The invention claimed is:

1. An optical transceiver for controlling self-heating according to temperature, comprising:
   a receiver optical sub-assembly;
   a transmitter optical sub-assembly, including:
      a laser diode;
      a plurality of lead pins;
      a stem body which is coupled with the laser diode and between the laser diode and the lead pins;
      a positive temperature co-efficient (PTC) heater which is coupled with the stem body to be self-heated;
      a laser driving unit which drives the laser diode, and
      an input/output port coupled to the receiver optical sub-assembly and the transmitter optical sub-assembly;
   wherein the stem body and the PTC heater are coupled with each other by means of a plurality of holes provided in the PTC heater and the lead pins inserted into the holes of the PTC heater.

2. An optical transceiver for controlling self-heating according to temperature, comprising:
   a receiver optical sub-assembly;
   a transmitter optical sub-assembly, including:
      a laser diode;
      a plurality of lead pins;
      a stem body which is coupled with the laser diode and between the laser diode and the lead pins;
      a positive temperature coefficient (PTC) heater which is coupled with the stem body to be self-heated;
      a control circuit unit which controls the PTC heater; and
      a laser driving unit which drives the laser diode, and
      an input/output port coupled to the receiver optical sub-assembly and the transmitter optical sub-assembly;
   wherein the stem body and the PTC heater are coupled with each other by means of a plurality of holes provided in the PTC heater and the lead pins inserted into the holes of the PTC heater.

3. The optical transceiver of claim 1, wherein the PTC heater is made of a $BaTiO_3$ material.

4. The optical transceiver of claim 1, wherein the thickness of the PTC heater is between 0.2 to 1.00 mm.

5. The optical transceiver of claim 2, wherein the control circuit unit includes:
   a thermistor which senses a temperature of the PTC heater;
   a switching unit which is turned on or off by the thermistor to apply power to the PTC heater; and
   a resistor which controls a strength of applied power.

6. The optical transceiver of claim 2, wherein the PTC heater is made of a $BaTiO_3$ material.

7. The optical transceiver of claim 2, wherein the thickness of the PTC heater is between 0.2 to 1.00 mm.

* * * * *